US008221853B2

(12) United States Patent
Marcinek et al.

(10) Patent No.: US 8,221,853 B2
(45) Date of Patent: Jul. 17, 2012

(54) MICROWAVE PLASMA CVD OF NANO STRUCTURED TIN/CARBON COMPOSITES

(75) Inventors: Marek Marcinek, Warszawa (PL); Robert Kostecki, Lafayette, CA (US)

(73) Assignee: The Regents of the University of California, Oakland, CA (US)

( * ) Notice: Subject to any disclaimer, the term of this patent is extended or adjusted under 35 U.S.C. 154(b) by 277 days.

(21) Appl. No.: 12/549,716

(22) Filed: Aug. 28, 2009

(65) Prior Publication Data

US 2010/0055441 A1  Mar. 4, 2010

Related U.S. Application Data

(60) Provisional application No. 61/093,976, filed on Sep. 3, 2008.

(51) Int. Cl.
*H05H 1/24* (2006.01)
*B05D 5/12* (2006.01)

(52) U.S. Cl. ........ 427/576; 427/577; 427/115; 427/122

(58) Field of Classification Search ............... 427/576, 427/577, 115, 122, 126.1, 126.2
See application file for complete search history.

(56) References Cited

U.S. PATENT DOCUMENTS

| | | | |
|---|---|---|---|
| 5,552,178 A * | 9/1996 | Seo et al. | 427/64 |
| 6,664,006 B1 * | 12/2003 | Munshi | 429/305 |
| 7,998,367 B2 * | 8/2011 | Khraishi et al. | 252/506 |
| 2002/0034687 A1 * | 3/2002 | Tamura et al. | 429/231.95 |
| 2002/0146853 A1 * | 10/2002 | Karpov et al. | 438/20 |
| 2003/0026320 A1 * | 2/2003 | Land | 374/129 |
| 2004/0000861 A1 * | 1/2004 | Dorfman | 313/495 |
| 2004/0108298 A1 * | 6/2004 | Gao | 216/13 |
| 2008/0206484 A1 * | 8/2008 | Kostecki et al. | 427/575 |
| 2009/0304923 A1 * | 12/2009 | Mitra et al. | 427/217 |
| 2010/0035775 A1 * | 2/2010 | Viswanathan | 508/123 |

FOREIGN PATENT DOCUMENTS

| | | | |
|---|---|---|---|
| WO | WO 97/08356 | * | 3/1997 |
| WO | WO 2006/130739 | * | 12/2006 |

OTHER PUBLICATIONS

Marcinek, Marek, et al., "Microwave plasma chemical vapor deposition of nano-composite C/Pt thin-films." Electrochemistry Communications 9 (2007) 1739-1743.*

Marcinek, M., et al., "Microwave plasma chemical vapor deposition of nano-structured Sn/C composite thin-film anodes for Li-ion batteries." Journal of Power Sources 173 (2007) 965-971.*

(Continued)

*Primary Examiner* — Bret Chen
(74) *Attorney, Agent, or Firm* — Lawrence Berkeley National Laboratory; Stuart B. Chinn

(57) ABSTRACT

A method for forming a graphitic tin-carbon composite at low temperatures is described. The method involves using microwave radiation to produce a neutral gas plasma in a reactor cell. At least one organo tin precursor material in the reactor cell forms a tin-carbon film on a supporting substrate disposed in the cell under influence of the plasma. The three dimensional carbon matrix material with embedded tin nanoparticles can be used as an electrode in lithium-ion batteries.

21 Claims, 8 Drawing Sheets

OTHER PUBLICATIONS

Noh, Mijung, et al., "Amorphous Carbon-Coated Tin Anode Material for Lithium Secondary Battery". Chem. Mater. 2005, 17, 1926-1929.*

Bagley, Mark C., et al., "A Simple Continuous Flow Microwave Reactor". J. Org. Chem., 2005, 70, 7003-7006.*

Glasnov, Toma N., et al., "Microwave-Assisted Synthesis under Continuous-Flow Conditions". Macromolecular Rapid Communications, 2007, 28, pp. 395-410.*

Marcinek et al., "Microwave plasma chemical vapor deposition of nano-composite C/Pt thin-films," Electrochemistry Communications, vol. 9, No. 7, pp. 1739-1743, (Apr. 12, 2007).

Marcinek et al., "Microwave plasma chemical vapor deposition of nano-structured Sn/C composite thin-film anodes for Li-ion batteries," Journal of Power Sources, vol. 173, No. 2, pp. 965-971, (Sep. 4, 2007).

* cited by examiner

MICROWAVE PLASMA CVD OF NANO STRUCTURED TIN/CARBON COMPOSITES

CROSS REFERENCE TO RELATED APPLICATIONS

This application claims priority to U.S. Provisional Patent Application Ser. No. 61/093,976, filed Sep. 3, 2008, entitled Microwave Plasma CVD of Nano Structured Tin/Carbon Composites, which application is hereby incorporated herein by reference in its entirety.

STATEMENT OF GOVERNMENTAL SUPPORT

The invention described and claimed herein was made in part utilizing funds supplied by the U.S. Department of Energy under Contract No. DE-AC02-05CH11231 awarded to the Regents of the University of California for the management and operation of the Lawrence Berkeley National Laboratory. The government has certain rights in this invention.

TECHNICAL FIELD

This invention relates generally to methods for producing new metal/carbon composite materials, and more particularly to a method for producing tin-carbon composite materials in a single step process, which materials are particularly suitable for electrode applications in lithium ion batteries.

BACKGROUND OF THE INVENTION

In the realm of battery technology there is a continued need for new and improved cathode and anode materials for use with advanced generation lithium batteries with greater energy densities and improved cycle life properties. In most of the conventional lithium-ion systems, graphitic anodes are used as an intercalation host for lithium to form $LiC_6$. An extensive number of experimental approaches have been proposed to increase the electrode's electrochemical capacity including for example the alloying of lithium with metals such as tin (Sn). The first commercially available amorphous tin-based composite anode was introduced to the market by Sony in 2006, followed by studies of $Sn_{0.34}Co_{0.19}C_{0.47}$ systems which demonstrated the capabilities of these electrodes in high-energy Li-ion battery systems.

Unfortunately, one of the major obstacles to the use of pure tin as an active material is its large volumetric expansion during the alloying with lithium, which causes cracking and mechanical disintegration of Sn particles. Loss of mechanical and electronic integrity of the active materials leads to severe degradation of the composite anode upon cycling and dramatically shortens the cycle life of the electrode.

Several approaches have been proposed to overcome this problem, including the use of tin oxide as a soft matrix to ameliorate the expansion of the metal. Other approaches have included the use of tin alloys, minimizing the thickness of the electrode, as well as reducing the particle size and uniform particle distribution within the supporting matrix. Some of the fabrication techniques used have include autocatalytic deposition, ball milling, chemical reduction, electro deposition, pyrolysis, sputtering, plasma laser deposition, partial reduction, and vapor deposition. However, these processes often involve several time consuming steps and offer only limited control of particle size and distribution. Moreover, typical Sn and Sn-based alloy anodes are prepared using conventional lamination methods which involves slurry preparation (grinding, mixing with binders, and solvents), laminating, drying, heating, etc.

In our co-pending patent application entitled Graphitized Carbon Coatings for Composite Electrodes, Ser. No. 11/915,837, filed Nov. 28, 2007, which application is commonly assigned and is incorporated herein by reference in its entirety, we described a new process in which microwave plasma chemical vapor deposition (CVD) is used to form graphitic carbon films over substrates at low temperatures. In the microwave plasma CVD process, energy is transmitted directly to a target material through direct interaction between the microwaves and the molecules of the material. Thus film deposition rate is fast, and can reach several tens of microns per minute. According to various embodiments of that invention, it was found that by using microwave technology, highly graphitized carbon films with good conductivity could be produced without significant heating of the substrate.

SUMMARY OF THE INVENTION

It has now been found that using the microwave chemical vapor deposition processes of our referenced copending application, metal-carbon composites (from time to time alternatively referred to as carbon-metal composites), and more particularly tin-carbon composites can be formed in a simple, one-step microwave plasma chemical vapor deposition (MPCVD) process, the composites, in one embodiment formed as a powder or film, which product is particularly suitable for electrodes in lithium-ion batteries. By the processes of this invention, an easy, fast and inexpensive method for the direct formation of thin films of uniformly distributed ultra-fine grains of tin metal within an electronically conductive carbon matrix is provided. These pure Sn/C thin film composite electrodes exhibit improved electrochemical behaviors, which improvement is due in part to the high porosity of the film and the fine dispersion of Sn nanoparticles within the three dimensional carbon matrix formed following the MPCVD methods of the invention.

BRIEF DESCRIPTION OF THE DRAWINGS

The foregoing aspects and others will be readily appreciated by the skilled artisan from the following description of illustrative embodiments, when read in conjunction with the accompanying drawings.

DETAILED DESCRIPTION

The present invention provides a method for utilizing plasma technology and microwave electromagnetic radiation to manufacture metal-carbon composites, and particularly tin-carbon composites without the need for processing at high temperatures. These carbon-metal composites may be deposited as powders or directly onto supporting substrates as films, and have particular applicability as electrodes in lithium-ion batteries.

According to one aspect of the invention, microwave plasma chemical vapor deposition is used to form highly-conductive tin-carbon metal composite films. This is achieved by introducing a tin-containing organic precursor into a sealed reaction chamber, and in the presence of a supporting substrate subjecting the precursor compound to a controlled exposure to microwave energy. Prior to the deposition process the reactor is purged with a noble gas such as argon (Ar) and evacuated to low pressure ($1.2 \times 10^{-1}$ Torr). The microwave application causes an Ar-plasma to form in the chamber, which in turn causes the precursor material to simultaneously evaporate and pyrolize to form both a carbonaceous and a Sn material, the combination depositing as a thin film onto the supporting substrate. As deposited, the Sn/C composite is in the faun of a 3D array of graphitic carbon decorated with uniformly distributed Sn nanoparticles.

Figure 1:
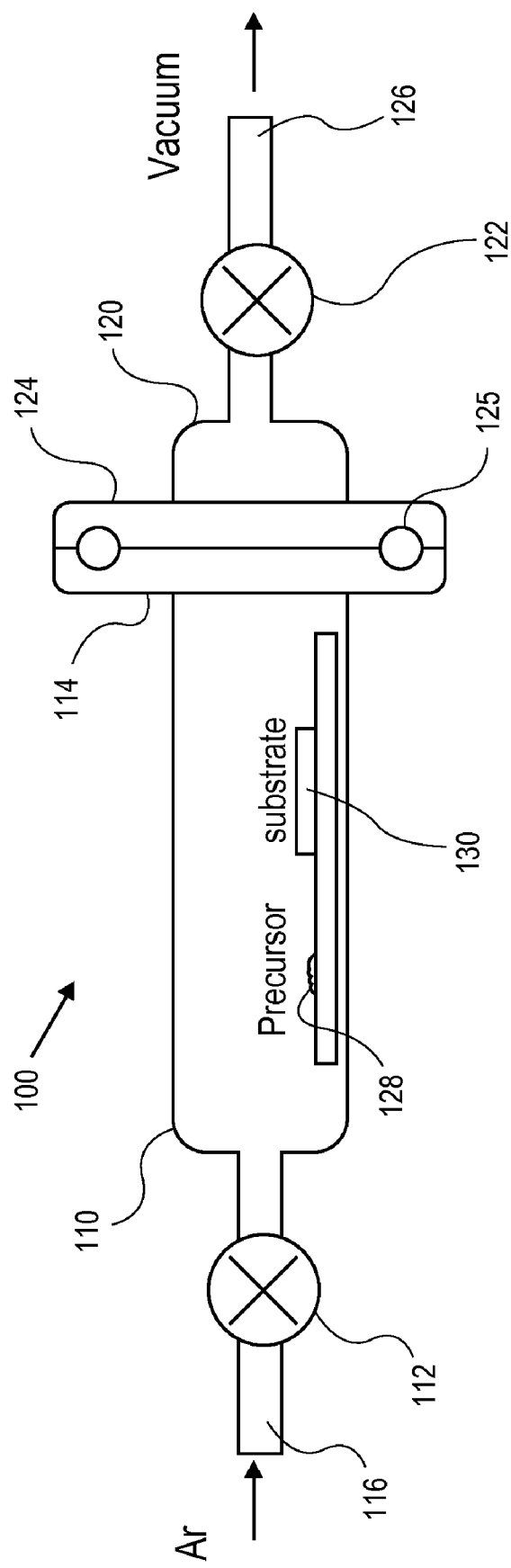
FIG. 1 is a schematic cross-sectional view of a reactor cell that can be used for MPCVD formation of Sn/C composites, according to an embodiment of the invention

FIG. 1 illustrates an exemplary embodiment of an apparatus useful for carrying out the method of this invention. Therein depicted is a cross-sectional view of a reactor cell 100, the reactor cell consisting of two cylindrical segments 110, 120. The cylindrical segments 110, 120 can be made of any material suitable for use in both vacuum and microwave environments. In one arrangement, the cylindrical segments 110, 120 are made of Pyrex™ glass. In another arrangement, the cylindrical segments 110, 120 are made of a quartz glass. Each cylindrical segment 110, 120 is fitted with a vacuum valve 112, 122, respectively, at one end and a collar 114, 124, respectively, with an O-ring fitting at the other. To assemble the reactor cell 100, the two collars 114, 124 of the cylindrical segments 110, 120, respectively, are pressed together with O-ring 125 fitted between. The two collars 114, 124 are held tightly together by a rubber clamp (not shown).

Prior to assembling the reactor cell 100, both the Sn—C precursor 128 and substrate 130 are placed in cylindrical segment 110. The substrate 130 can be made of any material suitable for use in vacuum and microwave conditions and on which a conductive tin-carbon film is desired. The substrate 130 can be a continuous solid, solid pieces, or in the form of a foil, powder or granules. Examples of suitable substrates 130 include conductive substrates such as aluminum or copper foil, silicon wafers, glass plates, polycarbonates, fluorinated Teflon-like plastics, and the like. The tin organo metallic precursor is then introduced into the segment 110 or into the segment 120 and placed in the vicinity of the substrate 130.

The reactor cell 100 is then assembled by connecting the two segments 110, 120, as described above. The vacuum valve 112 is connected to a neutral gas line 116. The vacuum valve 122 is connected to a vacuum line 126. The reactor cell 100 is flushed with a non-reactive or neutral gas to remove traces of residual gases. Suitable gases include a noble gas such as argon, or a non reactive gas such as nitrogen. In one arrangement, in which argon gas is used, the gas flows into the cell 100 at a rate of about 2 scf/hour for about 30s at ambient pressure. Then the vacuum valve 112 on the neutral gas line 116 is closed and the cell is evacuated through the vacuum line 126 to a base pressure of between about 1 mTorr and 100 mTorr, thus leaving the cell 100 filled with neutral gas at low pressure. The filling and evacuating procedure can be repeated any number of times as desired. When the desired base pressure is achieved, the vacuum valve 122 is closed.

The reactor cell 100 is placed near a microwave generator (not shown). The generator includes both a microwave source and a closed resonant metal cavity to contain the microwave radiation, and produce a standing wave radiation pattern, which pattern results in alternating wave nodes. The reactor, once assembled is placed in the resonant microwave cavity. In one arrangement, the cell 100 is positioned between about 5 mm and 1 m away from the microwave source. In another arrangement, the cell 100 is positioned between about 1 cm and 10 cm away from the microwave source. The microwave source can be any standard electromagnetic source capable of providing electromagnetic radiation within the microwave frequency range, i.e., between 300 MHz and 300 GHz. In one arrangement, frequencies between about 500 MHz and 100 GHz are used. In another arrangement, frequencies between about 750 MHz and 10 GHz are used. In yet still another arrangement, frequencies between about 1 GHz and 5 GHz are used. The microwave source is activated with a power input between about 10 W and 50 kW. In one arrangement, the power input is between about 100 W and 1200 W. In another arrangement, the power input is between about 600 W and 1000 W. The neutral gas in the reactor cell is excited by the microwaves, and a plasma created. The microwave radiation is continued for between about 1 second and 10 minutes. In one arrangement, the microwave radiation is continued for between about 2 seconds and 1 minute. In a still further arrangement, the microwave radiation is continued for between about 5 and 15 seconds.

As oxygen, to the extent it is present in the reactor, will react with carbon to form CO or $CO_2$, thus diminishing the efficiency of the deposition process, extra care should be taken to exclude oxygen from the reactor. One way of achieving this is to load and assemble the reactor cell 100 in a glove box (not shown) filled with dry nitrogen. As a further precaution, all reagents and system components can be dried prior to transfer to the glove box.

Depending on the nature of the substrate i.e., conductive or non-conductive, position of the substrate in the reactor and the temperature of plasma during microwave irradiation and the processing time, the temperature of the substrate may increase from ambient to several hundred degrees C. In one arrangement, the temperature of the substrate goes no higher than 200° C. during the deposition, though higher temperatures may be tolerated. Notably, the temperature should not exceed the melting point of the metal component of the film or of the melting point/decomposition temperature of the selected substrate. In the case of the substrate, higher temperatures can lead to melting or decomposition. In the case of the metal component of the metal organo precursor, higher temperatures can lead to melting and agglomeration of the metal particles. Temperature can be controlled in part, by a number of approaches, such as by limiting the processing time, conduction of the reaction at lower pressures, the lower the pressure in the rector vessel, the cooler the plasma formed in the MPCVD process, or by selection of the location of the reactor within the resonant cavity.

Interaction of the organo metallic precursor 128 in the cell 100 with the low-pressure plasma and strong electromagnetic microwave radiation initiates an evaporation and pyrolysis process in the gas phase at relatively low temperatures. Plasma pyrolysis of the organo metallic precursor yields uniform metal-carbonaceous aggregates of small, disoriented crystallites. The domains form an interconnected network with a micro and nano porous "lava rock" like structure. Uniform tin-carbon composites with thicknesses of from several tens of nanometers to several tens of micrometers can be formed on a substrate using this method. The process can be repeated several times to form even thicker deposits.

In some arrangements, multiple substrates can be loaded into the reactor cell. The positions of the substrates can be controlled from outside the reactor. An individual substrate or group of substrates can be moved into position to receive a tin-carbon film for a period of time. Then the substrate(s) can be moved into a shielded position and new substrate(s) moved into position to receive the composite film.

The quality of the MPCVD tin-carbon films, i.e., structure, conductivity and morphology, may vary with the microwave irradiation distribution inside the reactor. The microwave resonance within the generator results in alternating zones of low and high radiation intensity. The plasma distribution within the reactor follows the pattern of microwave radiation intensity (resulting in zones of high and low intensity plasmas). In one embodiment, the reactor is positioned within the generator cavity such that the substrate lies within one of the low intensity (cooler) plasma zones, the precursor located within a high intensity (hotter) plasma zone. When the hot edge of the plasma glow region is near the organo metal precursor source and the cool edge of the plasma glow region is near the substrate, evaporation/pyrolysis of the precursor is accelerated and the substrate is less likely to reach a high temperature.

In one embodiment, the reactor cell is designed for more continuous deposition of carbon films, such design allowing for non-stop feeding of a metallic foil to the reactor in a reel-to-reel type manufacturing process. Here, feed-through openings in the rector cell are provided to allow for the metallic foil to be passed through vessel, on either an intermittent or continuous basis, as the reels are wound. Generally these feed through openings will be opposed to each other, providing a straight path for the foil to follow as it moves through the reactor. In addition to the neutral gas line and vacuum line described above, an additional precursor feed line is provided to the cell. In one embodiment the precursor feed line can be a line separate from the neutral gas line, and in another embodiment the same line may be used for both functions. The precursor feed line can carry the organo metal carbon precursor materials in the form of gas, liquid, atomized liquid, or solid (e.g., powder or granules). In one embodiment, where the precursor is provided in the form of a solid, the feed line may be comprise a continuous belt one part of which passes through the reactor, with a continuous source of solid material carried by this belt into the reactor. The precursor line can be opened and closed (stopped and started) as needed, and the carbon films can be deposited continuously or semi-continuously. Finally, the precursor line and the foil feed-through openings of the reactor cell can be spaced from each other such that when the reactor cell is positioned within a microwave resonant cavity, the high intensity part of the plasma generated during the deposition process is adjacent the source of metal-organo precursor material, and the low intensity part of the plasma is proximate the substrate. A reactor cell of this type can be sized as needed for large-scale manufacturing.

In preparing the carbon-tin films of this invention, the three dimensional carbon matrix decorated with metal nanoparticles, the precursor can be gaseous, liquid, solid, or any combination thereof. Any organo-tin compound or mixture of compounds can be used in the MPCVD process. It is useful to use an organo tin that is very low in oxygen content so that a large portion of the carbon is not oxidized during processing, making it unavailable for forming the film. By way of example, and without intending to be limited thereby, suitable tin containing compositions useful for making the tin-carbon composites of the invention include Sn(IV) tert-butoxide, tin acetate, tin bis(acetylacetonate), tin 2-ethylhexanoate, tin oxalate, and tin phthalocyanine. Notably, the Sn/C films of this invention can be produced on various types of conductive and non-conductive substrate materials from a tin-based organic precursor without using stabilizers or reducing agents.

By way of illustrative example, using a reactor according to FIG. 1, a small amount (~2 mg) of Sn(IV) tert-butoxide [$Sn(OC(CH_3)_3)_4$] (available from Sigma-Aldrich) organic precursor was placed ~5 mm from a substrate (~1 $cm^2$ piece of Cu foil in one experiment, a similarly sized piece of glass in another) in the Pyrex glass tube reactor. The deposition process was carried out for 6 seconds at 1200 W microwave radiation power, which produced a ~5 μm thick nanocomposite Sn/C film. The qualitative analysis of the Sn/C films by inductively coupled plasma (Perkin Elmer Optima 5300DV ICP-OES) spectroscopy produced a C/Sn mass ratio of 2.5:1, i.e., much higher than in the Sn(IV) tert-butoxide (1.6:1). The thickness and composition of the film were reproducible and not dependent on the type of substrate.

The structure of carbon in composite Sn/C films was analyzed by Raman microscopy (Labram, ISA Group Horiba) with a laser excitation wavelength of either 632.8 or 488 nm, at 1 mW power at the sample surface. The morphology of the thin-film and the nanoparticle size were characterized by transmission electron microscopy (TEM, model JEOL 200CX), and scanning electron microscopy (SEM, model Hitachi S-4300 SE/N). An X-ray powder diffraction pattern of a Sn/C thin-film deposited on a glass substrate was obtained using a Philips X-Pert PRO diffractometer operating in Bragg-Brentano mode with Cu Kα radiation. The 2θ step size was 0.017° and counting time 400 s per step. The whole pattern fitting process was carried out using Powdercell software.

Electrochemical characterization was conducted in a He-filled glove box (VAC Inc.) with a model 273A Princeton Applied Research electrochemical station. The tests were carried out in a three electrode cell equipped with Li foil reference and counter electrodes and filled with the 1.0 M $LiPF_6$ EC/DMC (1:1 w/w) electrolyte. The cyclic voltammetry measurements were performed at 0.1 $mVs^{-1}$.

Figure 2:
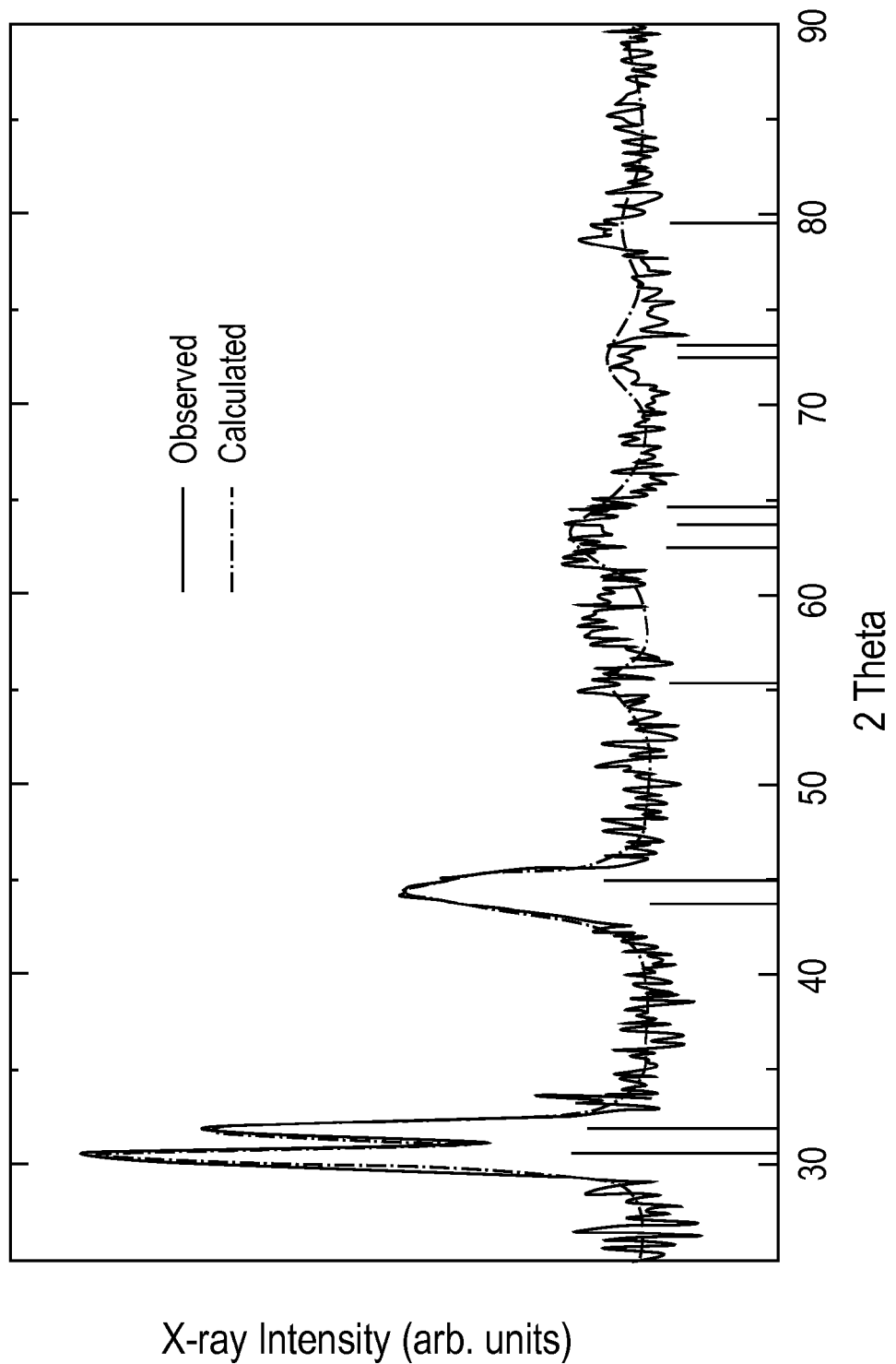
FIG. 2 is a plot of X-ray diffraction patterns of Sn/C composite film on glass. Vertical markers represent peak positions for bulk tetragonal Sn.

In FIG. 2, the X-ray diffraction pattern of the resulting 5 μm thick Sn/C film has been plotted. The low intensity of the pattern is due primarily to the high porosity of the film. The only phase clearly observed is elemental Sn. The average Sn crystallite size calculated using the Scherrer equation was ~15 nm.

Figure 3:
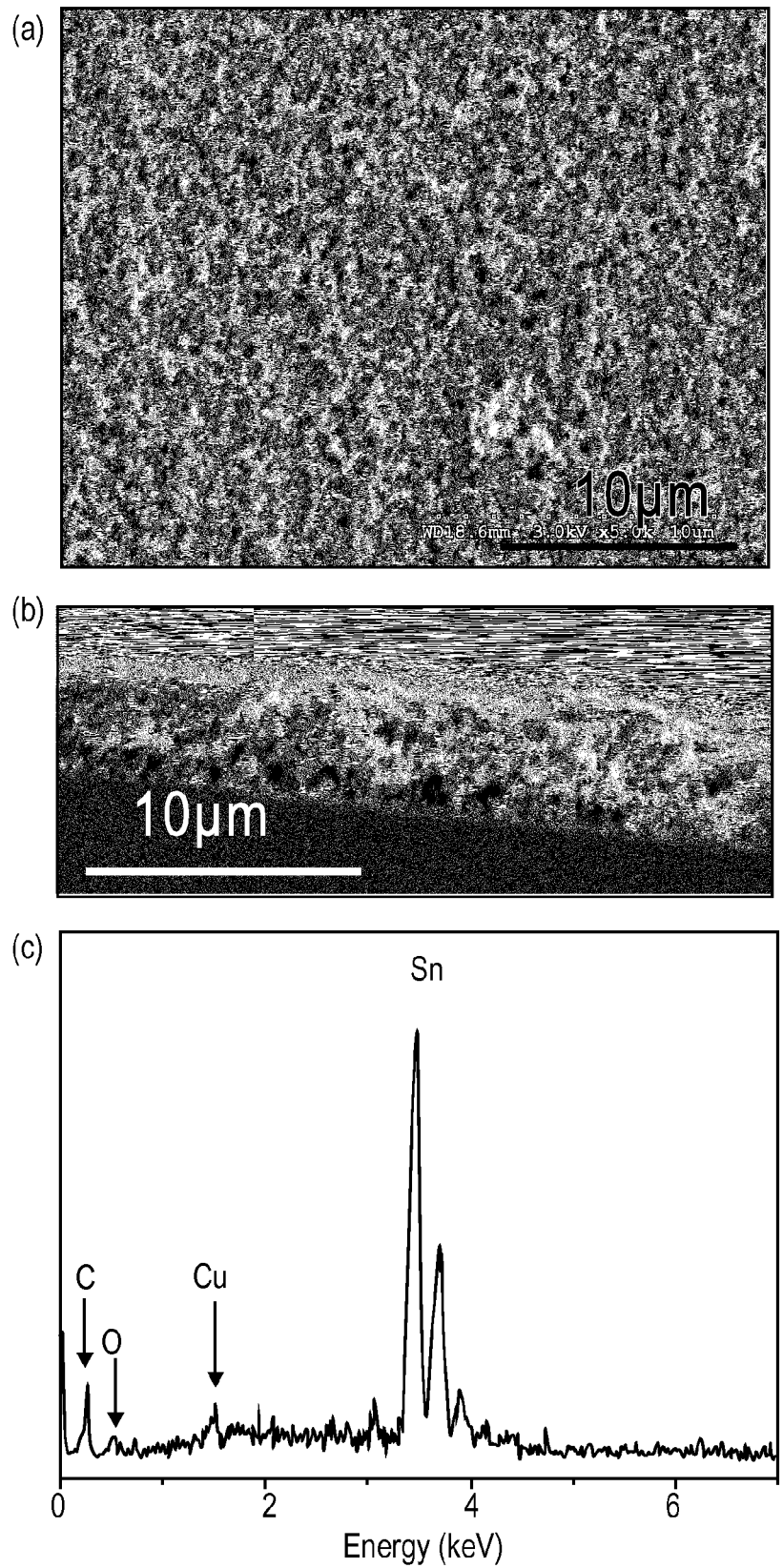
FIGS. 3(a) and (b) are SEM micrographs of the surface, and cross section respectively, and FIG. 3(c) the corresponding EDX spectrum of the Sn/C composite thin film of FIG. 2 deposited by MPCVD on Cu foil.

SEM images (FIG. 3(a)) of the surface morphology and cross-section of the Sn/C composite layer (3b) display a uniform thin-film of fairly constant thickness ca. 5-6 μm. The morphology of this porous film is consistent in the film bulk and at the surface. The film is made up of large 300-600 nm agglomerates. The aggregates consist of small disoriented crystallites. The domains form an interconnected network with a micro- and nano-porous "lava rock" like structure. The EDX spectrum of the Sn/C film (FIG. 3c) shows strong signals characteristics for tin, carbon and copper substrate. A small contribution from oxygen suggests the presence of tin oxide impurities in the layer.

Figure 4:
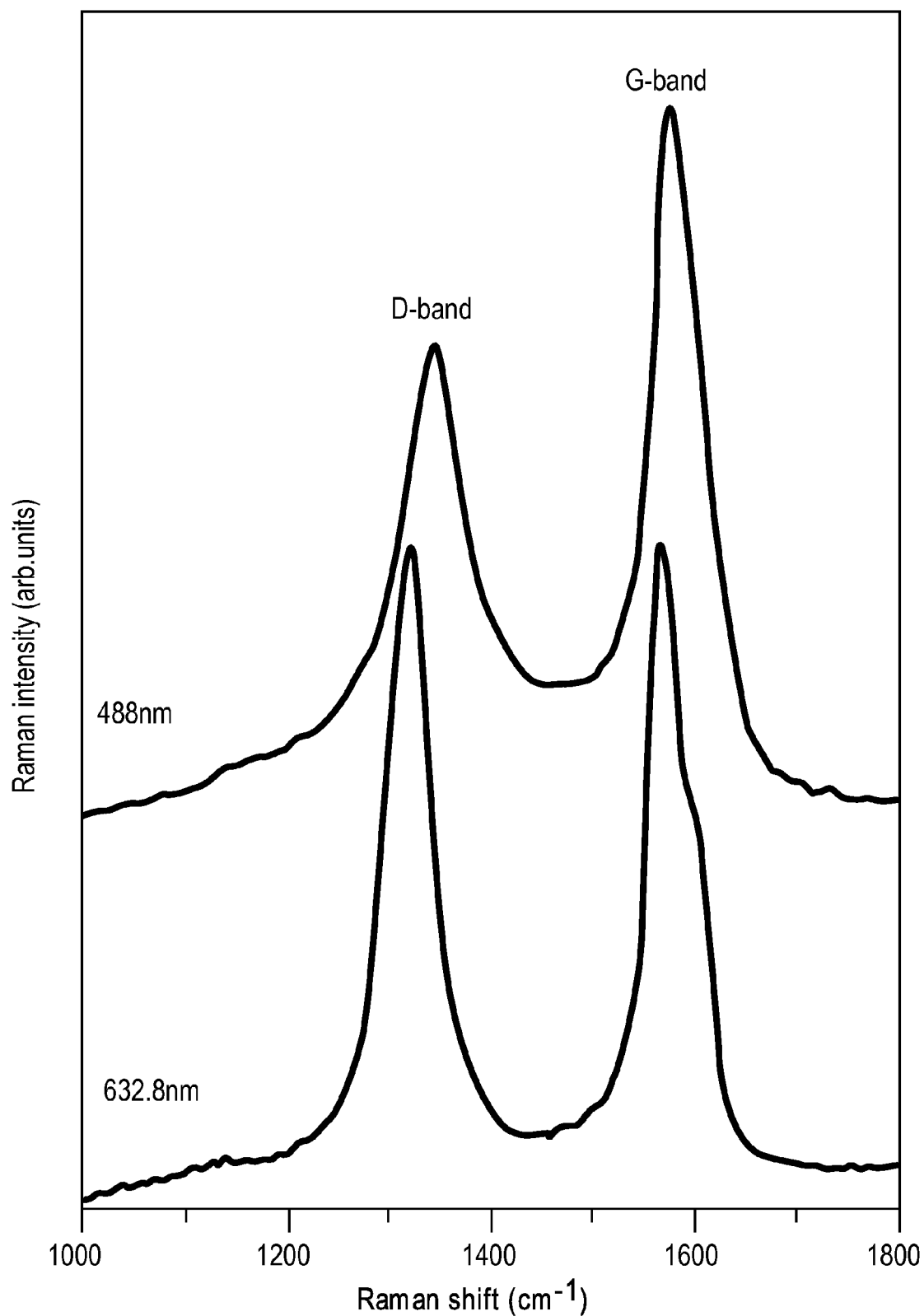
FIG. 4 depicts the Micro-Raman spectra of the Sn/C composite film of FIG. 2 recorded at 488 and 632.8 nm excitation wavelength.

The typical Raman spectra of a Sn/C thin-film recorded at two excitation wavelengths 632.8 and 488 nm are illustrated in FIG. 4. The spectrum recorded at 632.8 nm wavelength exhibits two intense peaks assigned as the G- and D-band at 1583 and 1323 cm$^{-1}$ that correspond to the $E_{2g}$ and $A_{1g}$ carbon vibration modes, respectively. The D-band is associated with the break in symmetry occurring at the edges of the graphite sheets. A shoulder at 1620 cm$^{-1}$, known as the D'-band, is also attributed to discontinuity and disorder within graphene planes.

The presence of strong graphite G and D modes along with the absence of a sharp diamond Raman peak at ~1330 cm$^{-1}$ in the Raman spectra suggests that the Sn/C films consist mainly of a sp$^2$-coordinated carbon phase. The observed shift of the D-band position from 1323 to 1344 cm$^{-1}$ and the decreased peak intensity as the laser excitation is varied from 632.8 to 488 nm represents typical spectral behavior of nano-crystalline graphite with a high degree of disorder.

Figure 5:
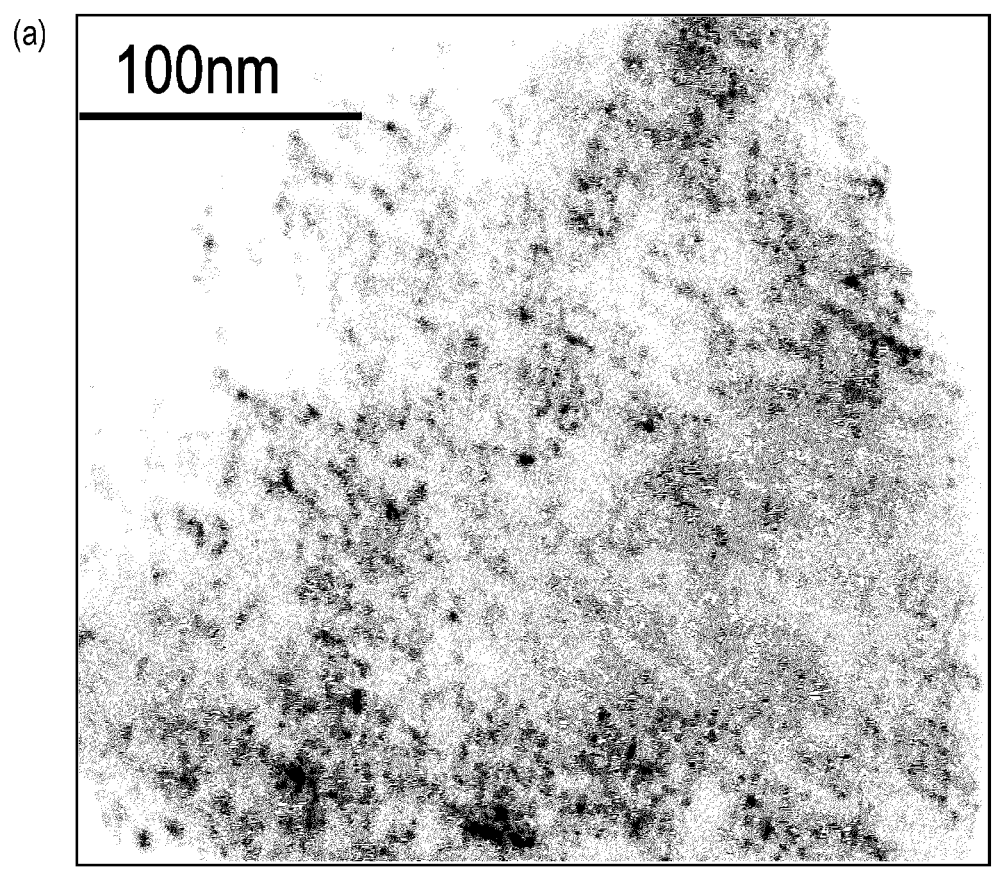
FIG. 5(a) is a Dark-field TEM image of the same Sn/C composite deposited by MPCVD, and FIG. 5(b) a diagram of Sn particle size distribution in the Sn/C composite.
Figure 5:
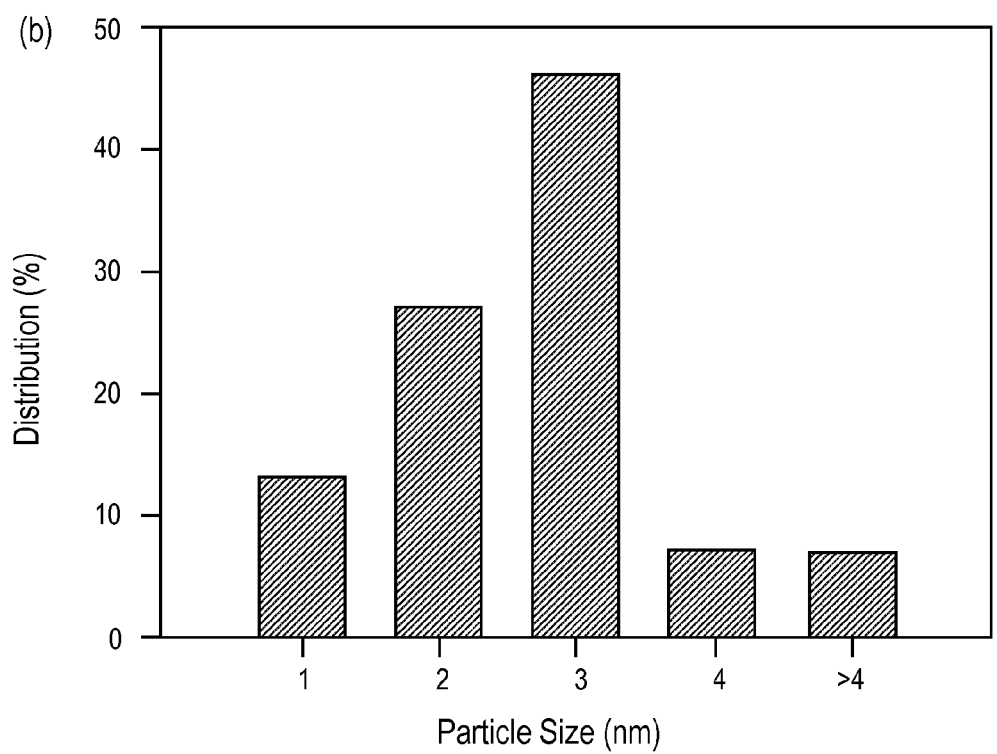

The dark-field TEM picture of the Sn/C composite is shown in FIG. 5(a). The dark contrast area is attributed to carbon, whereas light contrast spots represent Sn nano particles. The images show a remarkably uniform and fine dispersion of tin in the Sn/C composite. To determine the Sn particle size distribution in the Sn/C film, one hundred randomly selected Sn particles from the magnified TEM images were measured. The statistical representation of the Sn particle size distribution is displayed in FIG. 5b. The particle size distribution is very narrow; the calculated average size of Sn particles (ca. 2.75 nm) is noticeably smaller than the average particle size estimated from the X-ray data. The discrepancy between XRD and TEM particle sizes may be due to the presence of a small number of larger particles that contribute strongly to the XRD pattern. It is believed one possible source of larger particles (having a size exceeding 10 nm) is agglomeration, which as previously noted, could be a byproduct of improper placement in the reported example of the reactor within the resonant cavity, resulting in higher temperatures at the substrate during film formation. While these larger particles may represent a small fraction of the particles, they could represent a significant fraction of the mass of Sn and have negative impact on the electrochemical cycling behavior of the Sn/C electrode.

Figure 6:
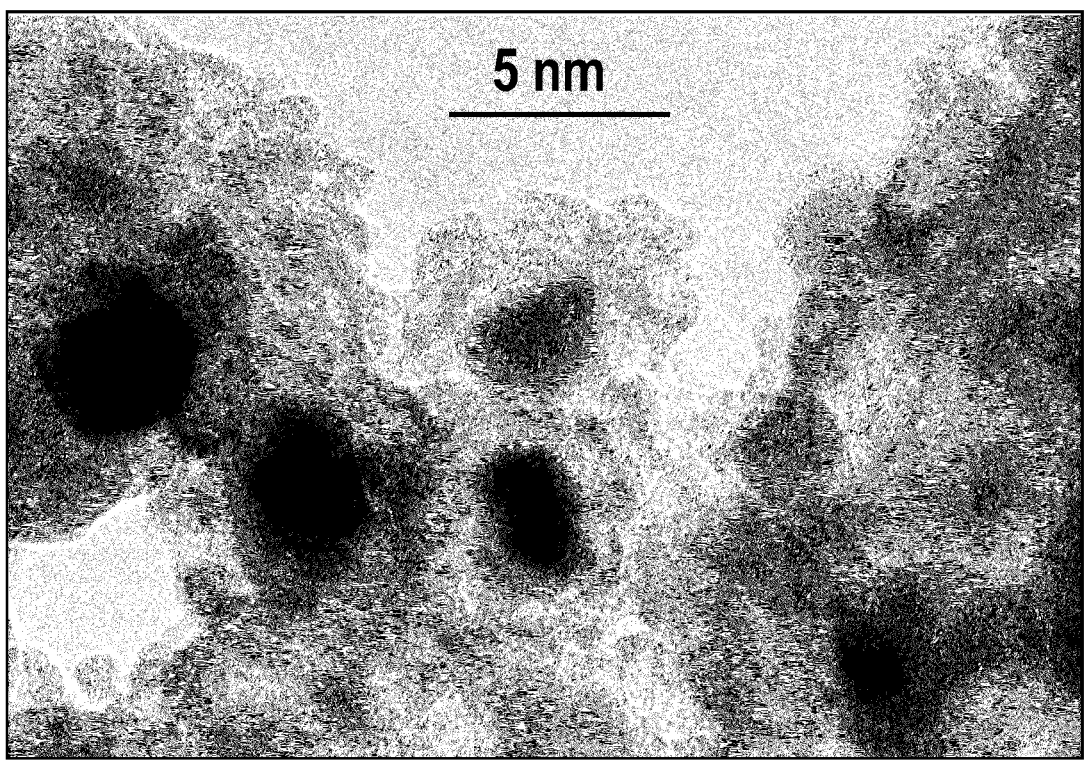
FIG. 6 is an HRTEM image of the same Sn/C nano-composite synthesized by MPCVD according to the instant invention.

The HRTEM image of the Sn/C agglomerate (FIG. 6) reveals a few 1-5 nm Sn particles (dark areas) that are fully embedded in partially graphitized, carbonaceous material. The presence of nanocrystalline tin particles was confirmed by their electron diffraction patterns. The carbon shows relatively large c.a. 10-15 nm well-organized graphene domains in the bulk of the agglomerate as well as in locations adjacent to the Sn particles. It also displays regions where shorter layers of irregular shape prevail, which are typical of carbon blacks.

Figure 7:
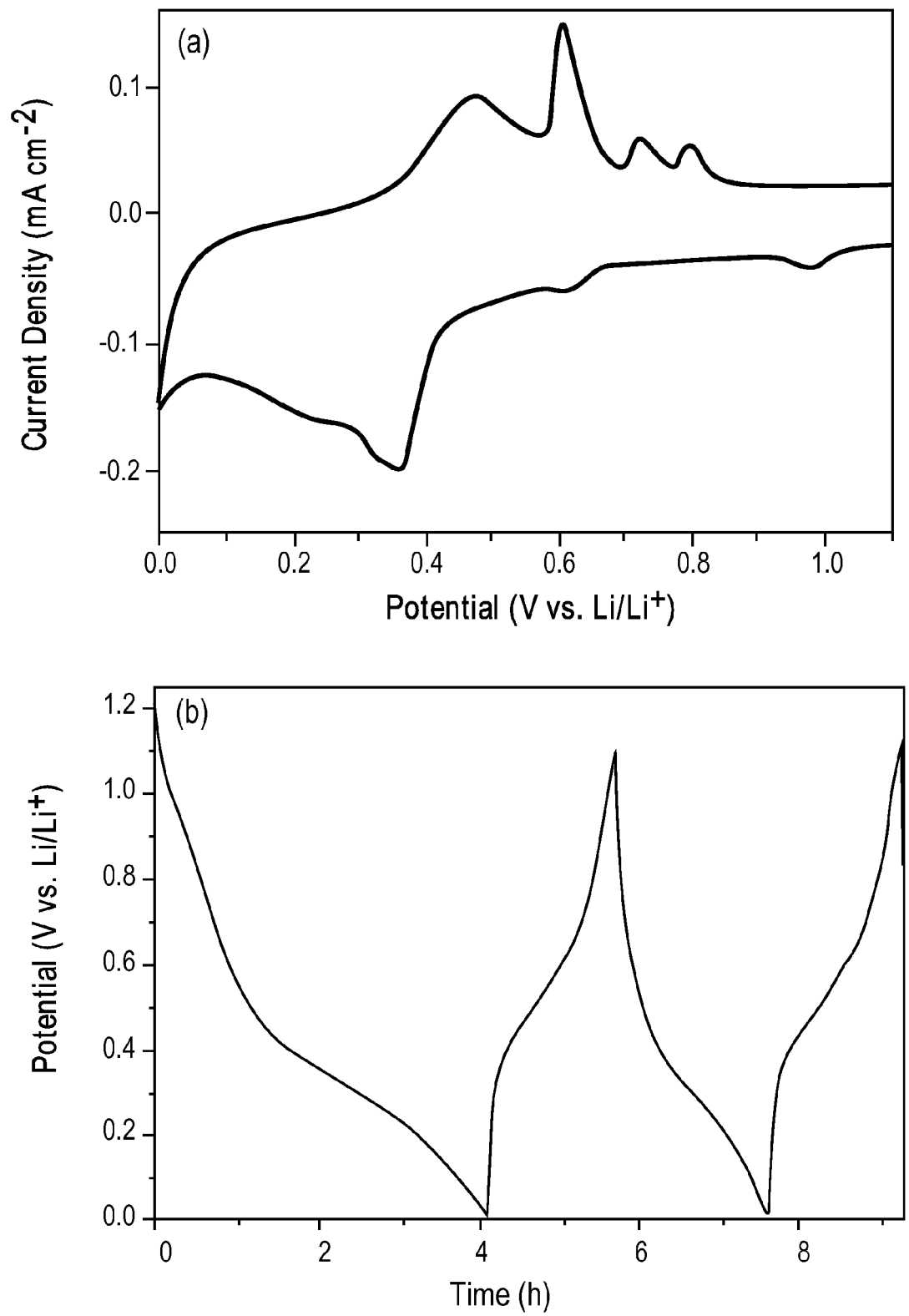
FIG. 7(a) is a first cyclic voltammetry scan of the Sn/C nanocomposite anode. Scan speed rate was 0.1 mVs$^{-1}$ and FIG. 7(b) first two galvanostatic cycles of the Sn/C electrode at 1 C rate.

The thin-film Sn/C anode was characterized by cyclic voltammetry (CV) in the 1.0 M LiPF$_6$ EC/DMC (1:1 w/w) electrolyte at 0.1 mVs$^{-1}$ scan rate (FIG. 7a). The CV profile is typical for tin, tin-based alloys or SnO$_2$ composites after several cycles where the Sn material is formed from tin oxide reaction with lithium in the first cycle. The large and broad cathodic peak at 0.37 V corresponds to the formation of highly lithiated phases i.e., Li$_{4.4}$Sn, Li$_{2.33}$Sn. The anodic scan exhibits four distinct peaks at 0.48, 0.62, 0.73, and 0.8 V, which correspond to the delithiation of Li$_{4.4}$Sn, Li$_{2.33}$Sn, LiSn, and Li$_{0.4}$Sn phases, respectively.

The Sn/C thin-film anodes display a relatively large reversible discharge capacity of ca. 440 mAhg$^{-1}$ (calculated for the total mass of the Sn/C layer). The reversible capacity originates exclusively from Sn nanoparticles and reaches ~880 mAhg$^{-1}$ of the Sn present in the film, which is close to the theoretical value of 993 mAhg$^{-1}$. The charge-discharging profiles display plateaus characteristic for tin but also show a significant contribution from the irreversible capacity (c.a. 400 mAhg$^{-1}$) in the first cycle. It is believed the irreversible capacity is mainly associated with the SEI layer formation on the carbon matrix and some small contribution from tin.

Figure 8:
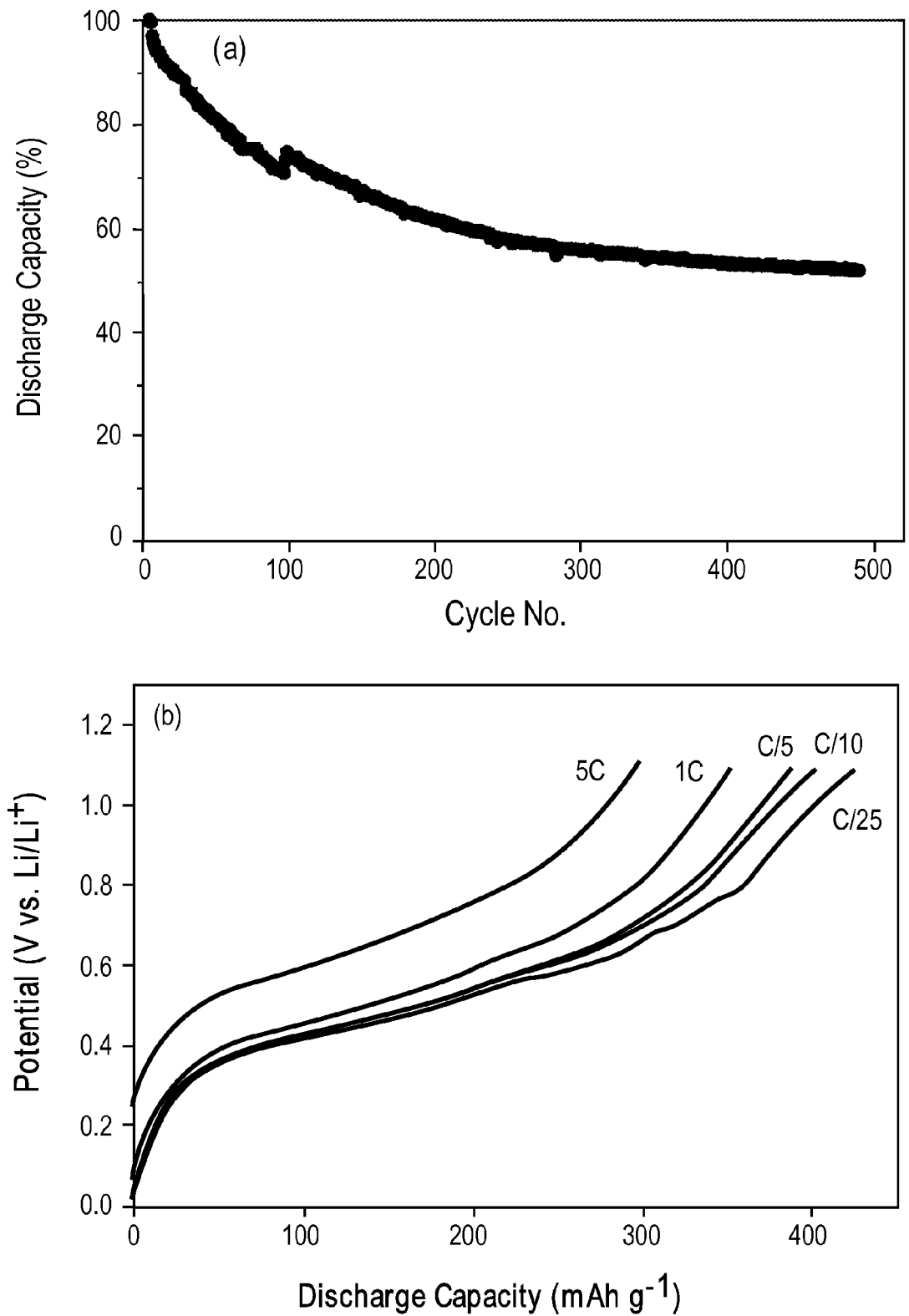
FIG. 8(a) is a plot of discharge capacity of the Sn/C thin film nanocomposite anode during long term cycling at room temperature at 1 C rate, and Figure (b) a plot of discharge capacity of the Sn/C anode at different rates (the electrode charged at C/10 prior to discharge at given rate).

The cycling performance of the Sn/C composite anode is illustrated in FIG. 8(a). The galvanostatic charge-discharge cycling was continued over 500 cycles at 1 C rate and showed only 40% capacity fading, which we believe presents a significant over the prior art To evaluate the power capability of the Sn/C composite anode the thin-film electrode was tested at different discharge rates. FIG. 8b shows the discharge curves at C/20, C/10, C/5, 1 C and 5 C rates, which correspond to 423, 400, 386, 349 and 297 mAhg$^{-1}$, respectively. Such an improved rate performance as compared to 160.5 mAhg$^{-1}$ at 2 C for the Sn-coated graphite or 200 mAhg$^1$ at 1.5 C for Sn—Co—C alloys suggests that vacuum deposition techniques to manufacture nano-structured metal-carbon thin-film anodes to be a promising technology for new generation lithium-ion batteries.

The improved electrochemical behavior of the Sn/C composite anode is mainly due to the high lithium diffusion coefficient at room temperature, high porosity of the film, and fine dispersion of Sn nanoparticles, which are embedded in the 3-dimensional carbon matrix. The 3-D composite design allows the accommodation of dimensional changes of Sn nanoparticles and the preservation of the structural and electronic integrity of the Sn/C electrode during cycling. The observed decrease of the reversible capacity is likely related to large tin clusters or particles, which are weakly bound to the surface of the carbon aggregates. The network-like 3-D architecture of the Sn/C thin-film provides mechanical support and good electrical contact between Sn active material and the current collector. The nanometer size of Sn particles helps contain stress that arises from the expansion/contraction of the crystalline lattice of Li$_x$Sn during charge-discharge processes and prevents particle decrepitation and the degradation of the composite anode.

The MPCVD co-synthesis of a nano-structured Sn/C composite thin-film presents a simple, fast, and inexpensive method for the one-step formation of electronically-conductive, carbon/metal composite powders or thin-films, which do not require the presence of binders, and which can be deposited on any type of substrate. The fast plasma discharge and the presence of microwave radiation accelerate the formation of sites suitable for in situ heterogeneous nucleation, and consequently, the growth and uniform dispersion of tin nanoparticles in the carbonaceous matrix. The electrochemical response of the Sn/C thin-film electrode in Li-ion system displays reversible charge-discharge activity, which is attributed mainly to Sn nanoparticles. The thin-film Sn/C electrodes delivered a reversible capacity of 440 and 297 mAhg$^{-1}$ at C/25 and 5 C discharge rates, respectively. A long term cycling of the Sn/C anodes showed 40% capacity loss after 500 cycles at 1 C rate. The improved electrochemical behavior of the Sn/C thin-film composite anode is mainly due to the high porosity of the film and fine dispersion of Sn nanoparticles, which are embedded in the 3-dimensional carbon matrix.

What we claim is:

1. A method of forming a metal-carbon composite material on a substrate, comprising the steps of:
    providing a reactor cell;
    placing a supporting substrate in the reactor cell;
    providing a source of metal-organo precursor material to the reactor cell;
    filling the reactor cell with a neutral gas at a pressure between about 1 mTorr and 100 mTorr;
    providing a microwave generator including a microwave radiation source and a microwave resonant cavity,
    placing the filled reactor cell into the microwave resonant cavity of said microwave generator,
    irradiating the reactor cell within said resonant cavity to produce a standing wave radiation pattern, thereby producing corresponding zones of high and low plasma intensities within the reactor cell; and thereby,
    forming the metal-carbon composite material upon the substrate.

2. The method of claim 1 wherein the reactor cell is positioned within the microwave resonant cavity such that the high intensity part of the plasma is adjacent the source of metal-organo precursor material, and the low intensity part of the plasma is proximate the substrate.

3. The method of claim 2 wherein the metal-carbon composite material is a tin-carbon composite and the metal-organo precursor is a tin-organo precursor.

4. The method of claim 3 wherein the tin organo precursor is selected from the group comprising Sn(IV)tert-butoxide, tin acetate, tin bis(acetylacetonate), tin 2-ethylhexanoate, tin oxalate, and tin phthalocyanine.

5. The method of claim 4 wherein the precursor material comprises Sn(IV)tert-butoxide.

6. The method of claim 1 wherein the supporting substrate is in the form of a continuous solid, solid pieces, a foil, a powder or granules.

7. The method of claim 1 wherein the composite material is formed on the substrate as a film.

8. The method of claim 7 wherein the composite film comprises a graphitic carbon film decorated with uniformly distributed metal nanoparticles.

9. The method of claim 8 wherein the metal nanoparticles are tin nanoparticles.

10. The method of claim 9 wherein the tin nanoparticles have sizes ranging between about 1 and 20 nm.

11. The method of claim 10 wherein the metal nanoparticles have sizes ranging between about 1 and 5 nm.

12. The method of claim 1 wherein the substrate temperature does not exceed its melting temperature.

13. The method of claim 12 wherein the substrate temperature does not exceed 200° C.

14. The method of claim 12 wherein the supporting substrate is copper.

15. The method of claim 12 wherein the supporting substrate is aluminum.

16. The method of claim 12 wherein the supporting substrate is glass.

17. A method of continuously forming a metal-carbon composite material on a substrate, comprising the steps of:
    providing a reactor cell, said reactor cell including an inlet for introduction of a neutral gas, a vacuum line outlet, a precursor feed line for introducing an organo-metal precursor into said rector cell, and opposed openings spaced from said precursor feed line, said openings configured to permit a continuous reel of metallic foil to be continuously passed through said reactor cell;
    introducing said metallic foil into the reactor cell;
    introducing a source of metal-organo precursor material to the reactor cell;
    filling the reactor cell with a neutral gas at a pressure between about 1 mTorr and 100 mTorr;
    providing a microwave generator including a microwave radiation source and a microwave resonant cavity,
    placing the filled reactor cell into the microwave resonant cavity of said microwave generator,
    irradiating the reactor cell within said resonant cavity to produce a standing wave radiation pattern, thereby producing corresponding zones of high and low plasma intensities within the reactor cell; and thereby,
    forming the metal-carbon composite material upon the substrate.

18. The method of claim 17 wherein the opposed openings for the passage of said metallic foil are spaced from said precursor feed line a distance such that when the reactor cell is positioned within the microwave resonant cavity, the high intensity part of the plasma is adjacent the source of metal-organo precursor material, and the low intensity part of the plasma is proximate the substrate.

19. The method of claim 18 wherein the organo-metallic precursor is introduced into the reactor cell in the form of a gas, liquid, solid powder or granules.

20. The method of claim 17 wherein the metallic foil is introduced into the reactor semi-continuously, on a reel to reel basis.

21. The method of claim 17 wherein the metallic foil is introduced into the reactor continuously, on a reel to reel basis.